United States Patent [19]

Inoue

[11] Patent Number: 5,382,829
[45] Date of Patent: Jan. 17, 1995

[54] PACKAGED MICROWAVE SEMICONDUCTOR DEVICE

[75] Inventor: Akira Inoue, Itami, Japan

[73] Assignee: Mitsubishi Denki Kabushiki Kaisha, Tokyo, Japan

[21] Appl. No.: 32,653

[22] Filed: Mar. 17, 1993

[30] Foreign Application Priority Data

Jul. 21, 1992 [JP] Japan .................. 4-217254

[51] Int. Cl.6 ............ H01L 49/00; H01L 23/48; H01L 27/04; H01L 29/34
[52] U.S. Cl. .................. 257/659; 257/508; 257/630; 257/668; 257/686; 174/254; 361/749
[58] Field of Search ........... 257/666, 662, 664, 691, 257/508, 659, 630, 668, 686; 174/254; 361/749, 750, 751

[56] References Cited

U.S. PATENT DOCUMENTS

| 3,533,023 | 10/1970 | Friend et al. | 257/659 |
| 3,766,439 | 10/1973 | Isaacson | 361/714 |
| 3,911,234 | 10/1975 | Kotaka | 174/254 |
| 4,550,357 | 10/1985 | Matsumoto | 174/254 |
| 4,956,695 | 9/1990 | Robinson et al. | 257/783 |
| 5,128,744 | 7/1992 | Asano et al. | 257/508 |

FOREIGN PATENT DOCUMENTS

| 981799 | 1/1976 | Canada | 257/700 |
| 073149 | 3/1983 | European Pat. Off. | 257/700 |
| 0389826 | 3/1990 | European Pat. Off. | |
| 393657 | 10/1990 | European Pat. Off. | 257/686 |
| 56-105659 | 8/1981 | Japan | 257/725 |
| 57-04161 | 11/1982 | Japan | . |
| 60-138951 | 7/1985 | Japan | . |
| 60-263447 | 12/1985 | Japan | 257/700 |
| 63-73944 | 5/1988 | Japan | . |
| 63-249362 | 10/1988 | Japan | 257/686 |
| 02130952 | 5/1990 | Japan | 257/659 |
| 02148759 | 6/1990 | Japan | 257/668 |
| 03097256 | 4/1991 | Japan | 257/686 |
| 3124052 | 5/1991 | Japan | . |
| 3151657 | 6/1991 | Japan | . |
| 03222354 | 10/1991 | Japan | 257/725 |
| 05013905 | 1/1993 | Japan | 174/254 |
| 743717 | 1/1956 | United Kingdom | . |
| 744628 | 2/1956 | United Kingdom | . |

Primary Examiner—Andrew J. James
Assistant Examiner—T. M. Arroyo
Attorney, Agent, or Firm—Leydig, Voit & Mayer

[57] ABSTRACT

A semiconductor device including an insulating film substrate having a surface, a high frequency semiconductor chip disposed on the surface, and circuit elements disposed on the surface and connected to the semiconductor chip wherein the insulating film substrate is bent into a U-shape, laminated, and encapsulated with a resin. The package of the device is miniaturized.

10 Claims, 9 Drawing Sheets

PACKAGED MICROWAVE SEMICONDUCTOR DEVICE

FIELD OF THE INVENTION

The present invention relates to a semiconductor device and, more particularly, to a high frequency package for use in a microwave band.

BACKGROUND OF THE INVENTIONS

FIG. 16 is a top plan view showing a film substrate of a prior art semiconductor device before molding. In the figure, reference numeral 1 designates an insulating film substrate, comprising, for example, polyimide having a thickness of 100 microns and dimensions of 6 mm×8 mm, and numeral 2 designates a semiconductor chip for use at high frequencies, for example, an amplifier which is several millimeters along each edge. Numerals 3a to 3e designate upper metal wiring patterns having a thickness of approximately 10 microns on the insulating film substrate 1, numeral 3a designates a grounding pad of the high frequency semiconductor chip 2, numeral 3b designates an external lead for exchanging signals with the high frequency semiconductor chip 2, numeral 3c designates a meandering type inductor for adjusting inductance when a bias voltage is applied to the high frequency semiconductor chip 2, numeral 3d designates a spiral type inductor similarly for adjusting inductance when bias voltage is applied to the high frequency semiconductor chip 2, and numeral 3e designates auxiliary wiring connected to the spiral type inductor 3d via a through hole described below. The upper metal wiring patterns 3b to 3d are respectively connected to the high frequency semiconductor chip 2 by wire 6 of gold or the like. Numeral 4 designates a through hole formed in the insulating film substrate 1 electrically connecting a lower metal wiring pattern 5 formed on the rear surface of the film substrate 1 to the upper metal wiring patterns 3 via a conductive material filling in the through hole 4, where an end part of the spiral type inductor 3d is connected to the auxiliary wiring 3e via the through holes 4 and the lower metal wiring pattern 5.

FIG. 17 is a cross section taken along a line A—A' of FIG. 16 showing a semiconductor device after molding. In the figure, numeral 8 designates a molding material for which resin is generally employed. Generally, the high frequency semiconductor chip 2 and the upper metal wiring pattern (grounding pad) 3a are die-bonded with solder or the like. A grounding conductive layer (which is not shown in the figure) on the rear surface of the high frequency semiconductor chip 2 is electrically connected to the upper metal wiring pattern (grounding pad) 3a. Further, numeral 4a designates a conductive material filling in the through hole 4.

Next, description is given of the operations.

In a semiconductor device operating at high frequencies such as in a microwave band, in general, since wires serve as distributed constant lines, the wires themselves operate as a passive circuit. Further, since the device operates at high frequencies, an inductor of minute inductance (approximately several nH) is often employed. In other words, the upper metal wiring patterns 3c and 3d on the film substrate 1 in FIG. 16 respectively serve as the meandering type inductor and the spiral type inductor, when a bias voltage is applied to the high frequency semiconductor chip 2 which is the amplifier. Since a passive circuit of wires is generally large as illustrated in FIG. 16, a package which is obtained by molding this passive circuit is also large.

As the prior art device is constructed as described above, the package is unfavorably oversized, resulting in an obstacle to miniaturization of a system including the package.

SUMMARY OF THE INVENTION

It is an object of the present invention to provide a semiconductor device in which a package size is miniaturized with the same functions as the prior art device without adversely effecting high frequency characteristics.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to the those skilled in the art from this detailed description.

In a semiconductor device in accordance with the present invention, the molding is conducted in a state where an insulating film substrate is bent and stacked on other films, an insulating film substrate is bent several times and laminated or an insulating film substrate is rolled in spiral shape. This provides a miniaturized package. By disposing an electromagnetic shielding layer between the laminated surfaces of the film substrate, coupling of high frequency signals between the neighboring surfaces of the film substrate is prevented, providing a package with less effect on high frequency characteristics.

Since a plurality of insulating film substrates are employed, the second film substrate adheres to the surface of the first film substrate opposite the surface, on which a semiconductor chip is disposed, and the semiconductor chip on the first film substrate is electrically connected to circuit elements on the second film substrate, or since molding is conducted in a state where the second film substrate is laminated and adheres to the first film substrate having the semiconductor chip covered with an insulating spacer material, and the semiconductor chip on the first film substrate is connected to the circuit elements on the second film substrate, the circuit is disposed in three dimensions, providing a miniaturized package.

When the second film substrate is laminated on the first film substrate, since an electromagnetic shielding layer is disposed on the second film substrate to cover the semiconductor chip on the first film substrate, radiation of electromagnetic wave from the circuit elements on the first film substrate or coupling of high frequency signals with the circuit elements outside the package is prevented, resulting in obtaining a package having high reliability.

By employing a material having a high rigidity for the film substrate on which the semiconductor chip is mounted, among the plural film substrates, a package that is easily fabricated and processed is provided, and that prevents bending stress from being added to the semiconductor chip, rarely causing destruction of the chip.

By covering the semiconductor chip or the circuit elements with a material having a dielectric constant lower than a molding material, parasitic capacitances over circuit elements such as the semiconductor chip or metal wiring patterns are reduced, providing a package having less deterioration in high frequency characteristics.

DETAILED DESCRIPTION OF THE PREFERRED EMBODIMENT

Embodiments of the present invention will be described in detail with reference to the drawings.

Figure 1:
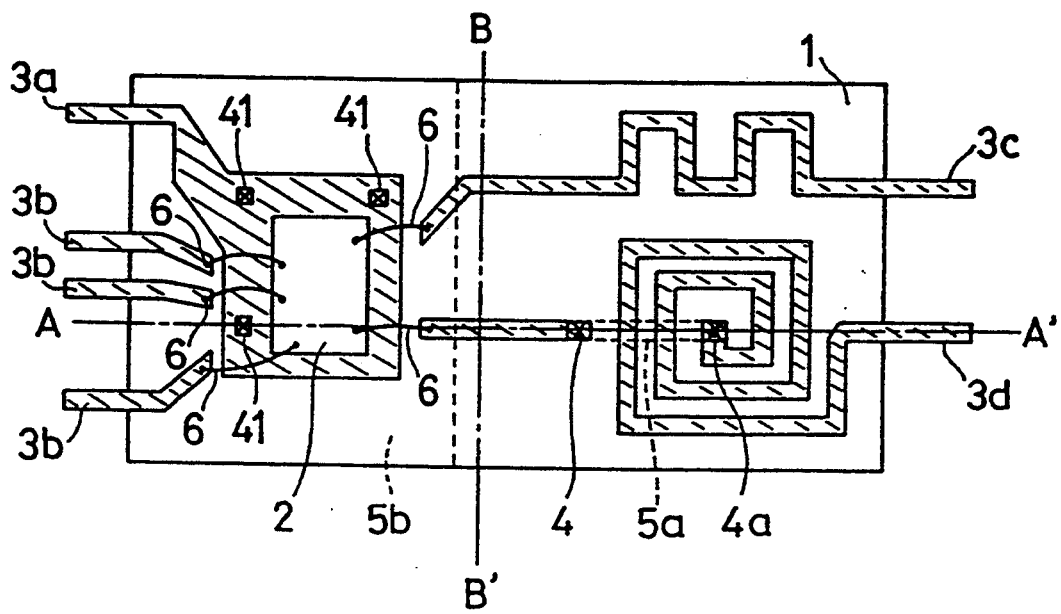
FIG. 1 is a top plan view showing an insulating film substrate of a semiconductor device before molding in accordance with a first embodiment of the present invention.
Figure 16:
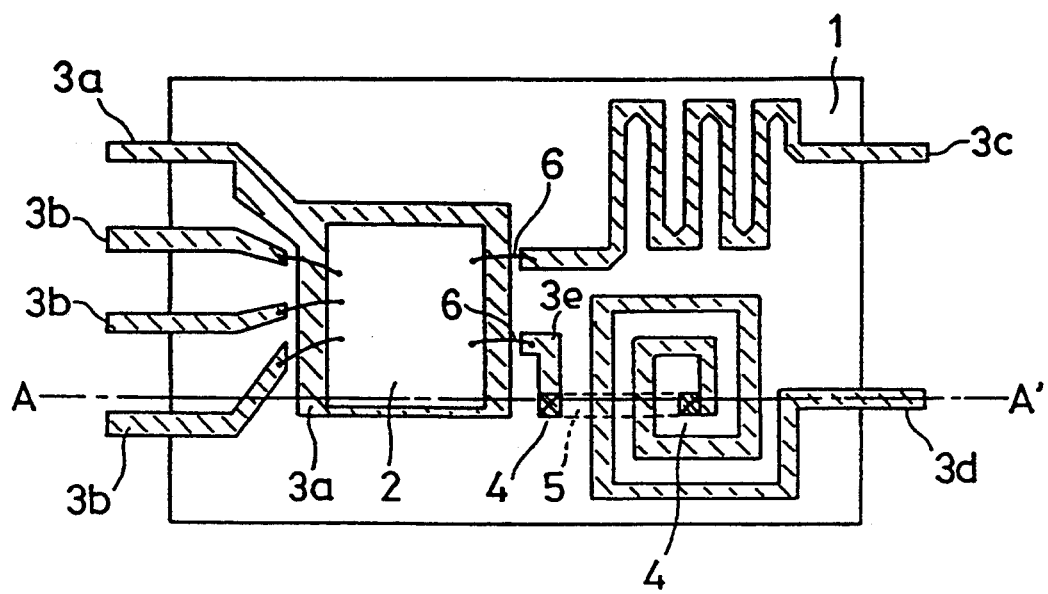
FIG. 16 is a top plan view showing a film substrate of a prior art semiconductor device before molding.
Figure 17:
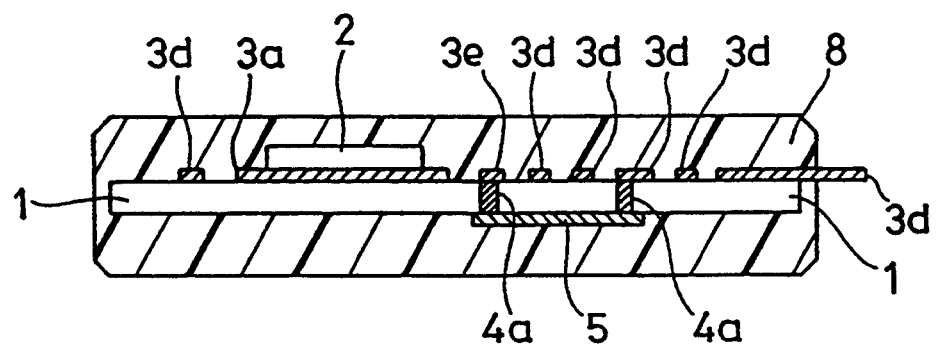
FIG. 17 is a sectional view showing the prior art semiconductor device.

FIG. 1 is a top plan view showing a semiconductor device before molding in accordance with a first embodiment of the present invention. In the figure, the same reference numerals as those of FIG. 16 designate the same or corresponding parts. Through holes 41 in insulating film substrate 1, for example, having a thickness of 100 microns and dimensions of 6 mm × 8 mm, are filled with a conductive material 41a to connect the grounding pad 3a on which the high frequency semiconductor chip 2 is mounted to a lower metal wiring pattern 5b. A line B—B' shows a bending position when the film substrate 1 is bent such that a lower metal wiring pattern 5a is opposite to the lower metal wiring pattern 5b.

Figure 2:
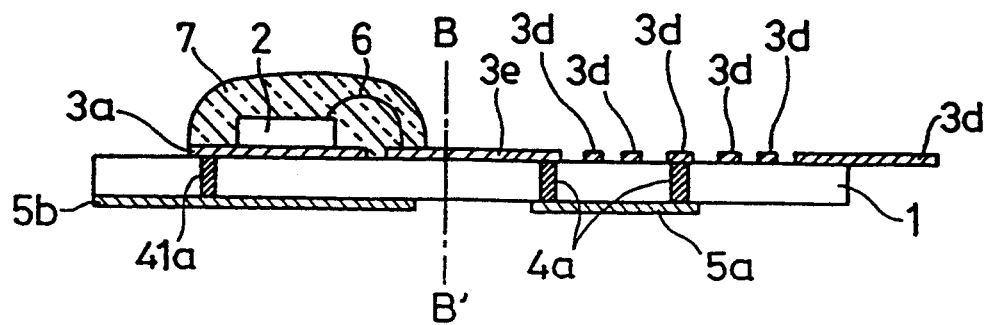
FIG. 2 is a cross sectional view showing the insulating film substrate of FIG. 1 after covering a semiconductor chip with a spacer material.

FIG. 2 is a cross section taken along a line A—A' of FIG. 1 showing a semiconductor device in which the surrounding volume of the semiconductor chip 2 before molding is filled with spacer material 7 having a low dielectric constant and high insulating property such as glass.

Figure 3:
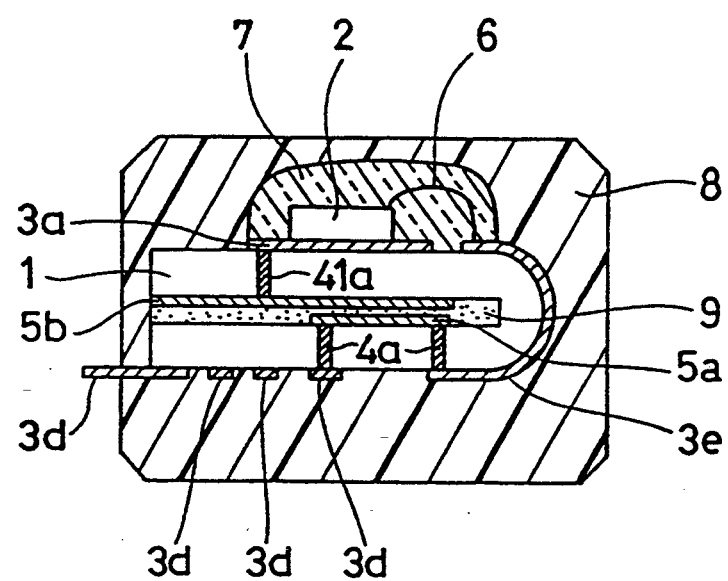
FIG. 3 is a cross sectional view showing a semiconductor device in which the semiconductor chip is covered with spacer material and the whole of the insulating film substrate is molded.

FIG. 3 is a cross section showing a semiconductor device in which the film substrate 1 shown in FIG. 2 is bent at a line B—B' and molded. Reference numeral 8 designates a molding resin. An insulating adhesive 9 fills in the space sandwiched by the rear surfaces of the bent film substrate 1.

Next, a description is given of a production method therefor.

Two methods for producing a semiconductor device illustrated in FIG. 3 will be described below.

(1) After die-bonding the semiconductor chip 2 on the film substrate 1 and connecting the chip 2 by wires 6, the film substrate 1 is bent along a line B—B' and molded.

(2) After bending the film substrate 1 along a line B—B' in advance, the semiconductor chip 2 is die-bonded, connected by wires 6, and molded.

The spacer material 7 may be produced at any time after bonding. Even in the method (1), it is possible to prevent bending stress from acting upon the spacer material 7 in bending the film substrate 1, by designing the length of the film substrate 1 in the longitudinal direction in the vicinity of the bending position B—B' to be several times as long as the thickness of the film substrate 1.

A description is given of the functions and the effects.

In this package, by bending the film substrate 1 at the bending position of a line B—B' of FIG. 1 and disposing the meandering type inductor 3c or the spiral type inductor 3d which is provided in the right side of the bending position of a line B—B' in the figure below the semiconductor chip 2, it is possible to arrange a circuit in three dimensions, resulting in miniaturization of the package.

By combining the upper metal wiring pattern (grounding pad) 3a connected to a grounding conductive layer on the rear surface of the semiconductor chip 2 by solder or the like, with the lower metal wiring pattern 5b via the through hole 41, the lower metal wiring pattern 5b serves as an electromagnetic shielding layer. As a result, it is possible to shield an electromagnetic field which cannot be sufficiently shielded by the grounding pad 3a, to prevent signals from influencing each other between neighboring signal lines, namely, so-called coupling, and to isolate electrically the semiconductor chip 2 from the inductors 3c and 3d, resulting in no deterioration of high frequency characteristics.

Still, by covering over the semiconductor chip 2 with the spacer material 7 having a dielectric constant lower than the molding material 8, parasitic capacitances of the molding material 8 can be reduced, resulting in reducing deterioration of high frequency characteristics due to parasitic capacitances.

In addition, while the insulating adhesive 9 is applied at intervals sandwiched by the bent film substrate 1 in the first embodiment, since the adhesive 9 is adapted to insulate the metal wiring 5a from the metal wiring 5b rather than to adhere materials, the insulating adhesive 9 is not required if the metal wirings 5a and 5b can keep a predetermined distance from each other and not short-circuit.

Figure 4:
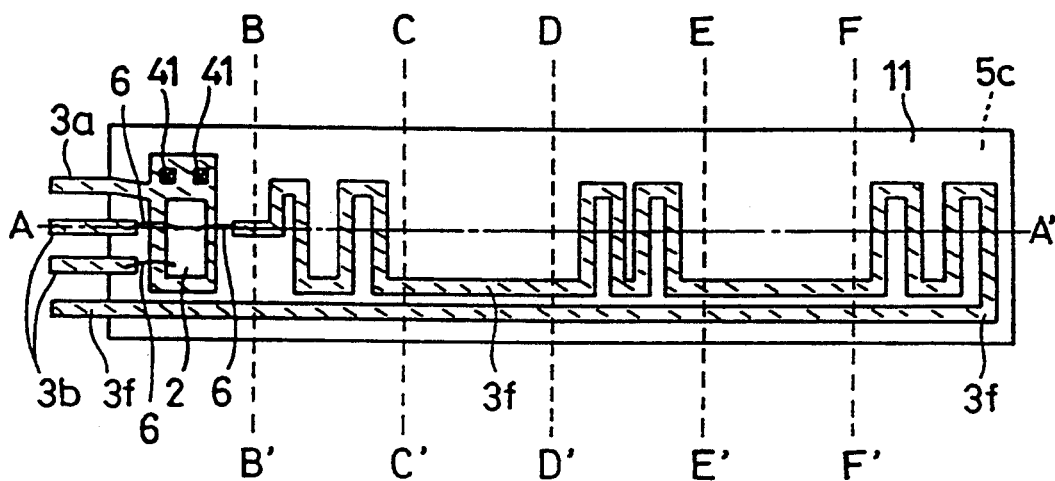
FIG. 4 is a top plan view showing an insulating film substrate of a semiconductor device before molding in accordance with a second embodiment of the present invention.

FIG. 4 is a top plan view showing a semiconductor device before molding in accordance with a second embodiment of the present invention. As illustrated in the figure, a relatively large meandering type inductor 3f is formed on an insulating film substrate 11 having a size corresponding to the inductor 3f and a lower metal wiring pattern 5c is formed on the whole rear surface, which is connected to the grounding pad 3a via the through hole 41.

Figure 5:
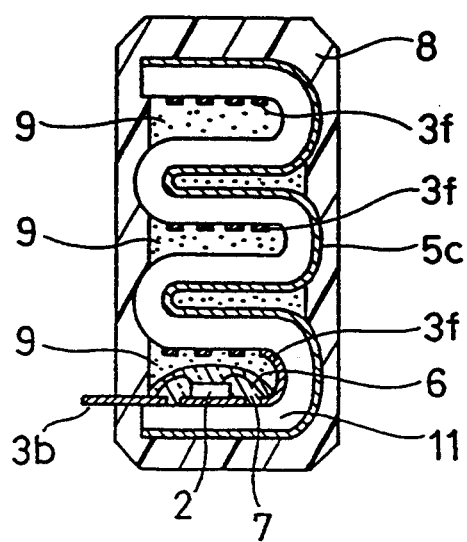
FIG. 5 is a cross sectional view showing the semiconductor device in which the insulating film substrate of FIG. 4 is molded.
Figure 6:
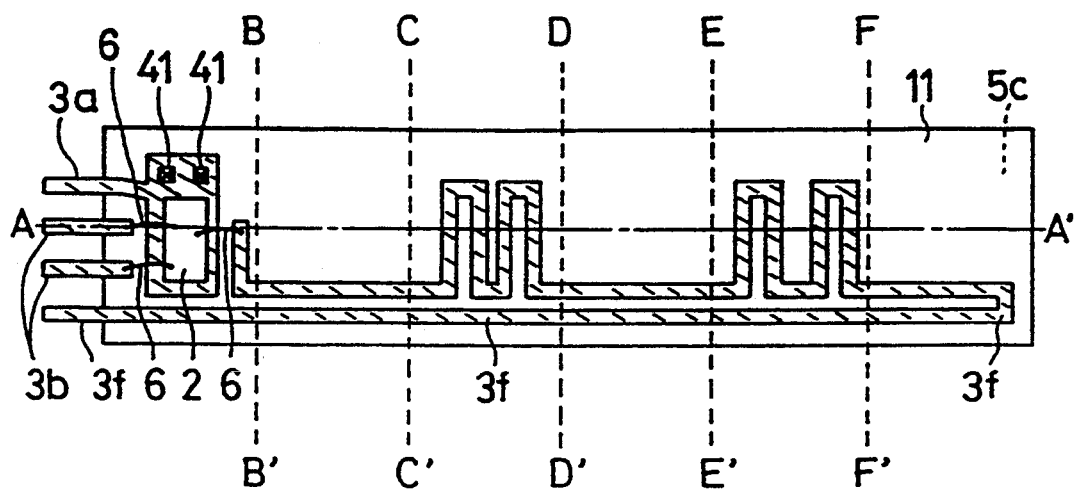
FIG. 6 is a top plan view showing an insulating film substrate before molding in accordance with a variation of the second embodiment of the present invention.
Figure 7:
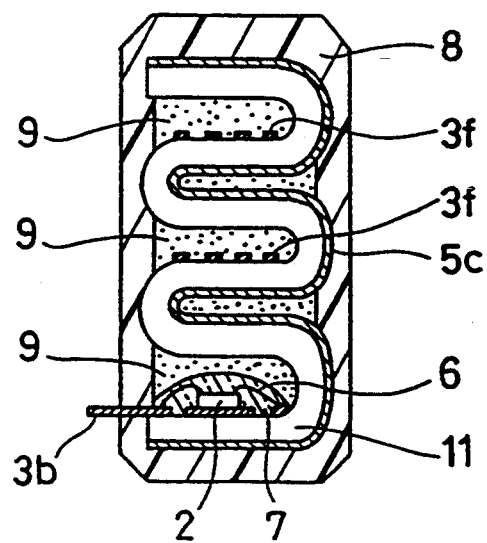
FIG. 7 is a cross sectional view showing the semiconductor device in which the insulating film substrate of FIG. 6 is molded.

FIG. 5 is a cross section taken along a line A—A' of FIG. 4 showing a semiconductor device in which the insulating film substrate 11 is bent at the respective parts, B—B', C—C', D—D', E—E' and F—F' like a bellows in cross-section and is molded. Thus, by bending the film substrate 11 several times, a circuit with a plurality of layers is disposed in three dimensions. As a result, in dealing with a long film substrate, it is possible to miniaturize a package to a greater extent than in a case where the film substrate is just folded in two as described in the first embodiment. Further, in this structure, by turning the film substrate 1 several times, it is possible to prevent coupling between neighboring units produced by the film substrate in a U-shape, each unit being separated by the lower metal wiring pattern 5c, while coupling occurs between the confronting film surfaces on one of which the semiconductor chip 2 is formed. In addition, by forming the meandering type inductor 3f not opposite the semiconductor chip 2, as illustrated in FIG. 6, and constructing the semiconductor device with the film turned several times, as illustrated in FIG. 7, coupling between the opposite upper and lower surfaces can be prevented, too. Here, while the insulating adhesive 9 is also applied in intervals sandwiched by the bent film substrate in this embodiment, the insulating adhesive 9 is not required when there is no problem by short-circuiting.

Figure 8:
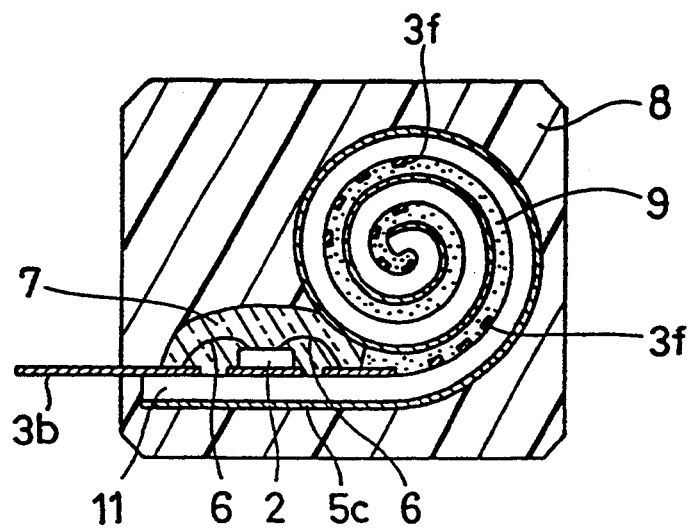
FIG. 8 is a cross sectional view showing a semiconductor device in accordance with a third embodiment of the present invention.

FIG. 8 is a cross sectional view showing a semiconductor device in accordance with a third embodiment of the present invention. As illustrated in the figure, in this embodiment, by rolling the film substrate 11 including the relatively large size inductor 3f as shown in FIG. 4 in whirlpool or spiral shape, a circuit is disposed in three dimensions. In order to produce such structure, the insulating adhesive 9 may be applied to the whole surface of the region of the film substrate 11 of FIG. 4 on which the inductor 3f is present and the film substrate 11 lefthandedly rolled up from one end to the other end. As a result, a package is miniaturized. Also, due to the lower metal wiring pattern 5c intervening between the neighboring portions of the film substrate, it is possible to reduce coupling of high frequency signals which may occur in the circuit constructed in three dimensions, resulting in no deterioration of high frequency characteristics.

Figure 9:
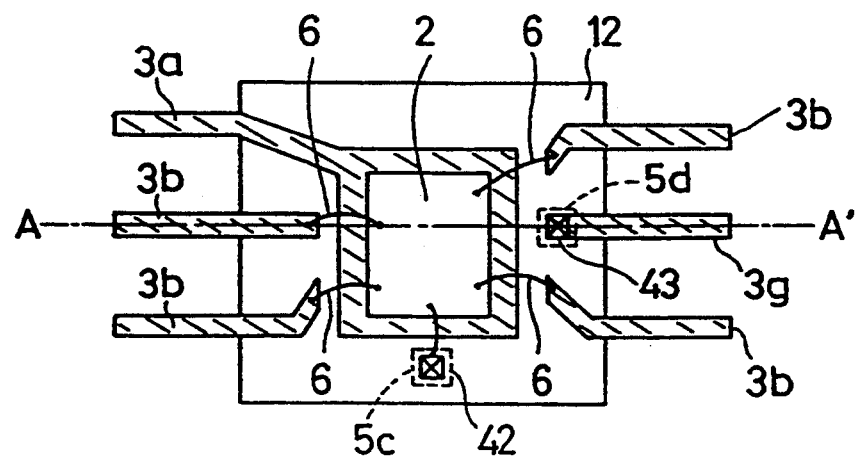
FIG. 9 is a top plan view showing a first film substrate before molding in accordance with a fourth embodiment of the present invention.
Figure 10:
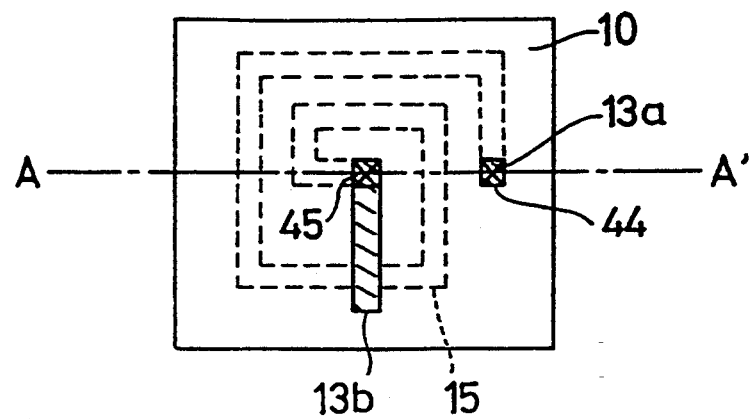
FIG. 10 is a top plan view showing a second film substrate before molding in accordance with the fourth embodiment of the present invention.
Figure 11:
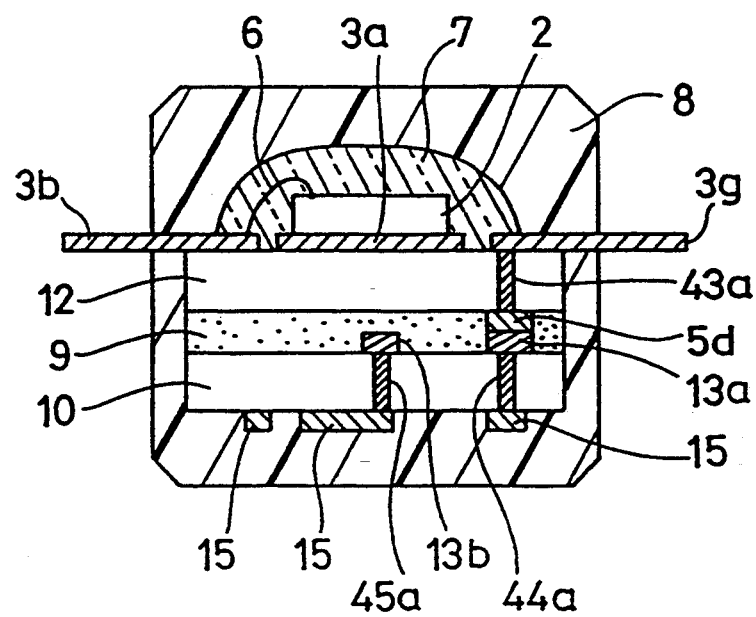
FIG. 11 is a cross sectional view showing a semiconductor device in which the first and the second film substrates are molded in the fourth embodiment.

FIG. 9 is a top plan view showing a first film substrate 12 on which the semiconductor chip is mounted in accordance with a fourth embodiment of the present invention. FIG. 10 is a top plan view showing a second film substrate 10 on which a spiral type inductor is disposed. In this embodiment, as illustrated in FIG. 11, employing two film substrates and forming a circuit on each film substrate, molding is conducted with these film substrates laminated.

More particularly, in the figures, the semiconductor chip 2 is die-bonded to the grounding pad 3a on the top surface of the first film substrate 12, and the chip 2 is connected to the external lead 3b by wiring 6 and connected to the lower metal wiring pattern 5c via a through hole 42. An upper metal wiring pattern 3g for applying a bias voltage to the inductor on the top surface of the first film substrate 12 is connected to a lower metal wiring pattern 5d via a through hole 43. Here, the lower metal wiring patterns 5c and 5d serve as connecting pads. On the rear surface of the second film substrate 10, a spiral type inductor is formed by a lower metal wiring pattern 15 and both ends thereof are respectively connected to the upper metal wiring patterns 13a and 13b via through holes 44 and 45. Here, the upper metal wiring pattern 13a serves as a connecting pad with the lower metal wiring pattern 5d on the rear surface of the first film substrate 12. The upper metal wiring pattern 13b serves as auxiliary wiring for connecting with the lower metal wiring pattern 5c on the rear surface of the first film substrate 12.

In the first film substrate 12 constructed as described above, the semiconductor chip 2 is covered with the spacer material 7 after wire-bonding. And, as illustrated in FIG. 11, the rear surface of the first film substrate 12 is opposite to the top surface of the second film substrate 10, the insulating adhesive 9 is applied between these film substrates, and the lower metal wiring patterns 5c and 5d on the rear surface of the first film substrate 12, are contacted, respectively, with upper metal wiring patterns 13b and 13a on the top surface of the second film substrate 10. Next, in this state, molding is carried out with the molding material 8. Here, reference numerals 43a, 44a and 45a designate conductive materials filling, respectively, the through holes 43, 44 and 45.

As constructed as described above, since the spiral type inductor 15 is disposed in three dimensions under the semiconductor chip 2, the package is diminished in size. Further, in this embodiment, since only the semiconductor chip 2 is mounted on the first film substrate 12, it is possible to prevent coupling of high frequency signals between the semiconductor chip 2 and the spiral type inductor comprising the metal wiring 15, by the grounding pad 3a connected to the grounding electrode on the rear surface of the semiconductor chip 2, resulting in no deterioration of high frequency characteristics. In addition, in this embodiment, since the semiconductor chip 2 is covered with the spacer material 7 having a dielectric constant lower than the molding material 8, it is possible to suppress unnecessary parasitic capacitances, resulting in forming a package having improved high frequency characteristics. Further, by employing a material such as a ceramic for the first film substrate 12, which is harder than the second film substrate 10, the second film substrate 10 is bent and the first and the second film substrates 12 and 10 are laminated, preventing damage by bending of the semiconductor chip 2, due to thermal deformation of resin 7 during molding. In addition, even if differences arise in intervals between the film substrates depending on the coated state of the insulating adhesive 9, the underlying film substrate 10 is deformed because the film substrate 12 has a higher rigidity than the film substrate 10. Thereby, the lower metal wiring patterns 5c and 5d are kept in contact with the upper metal wiring patterns 13b and 13a, resulting in easily processing and fabricating of the package.

Figure 12:
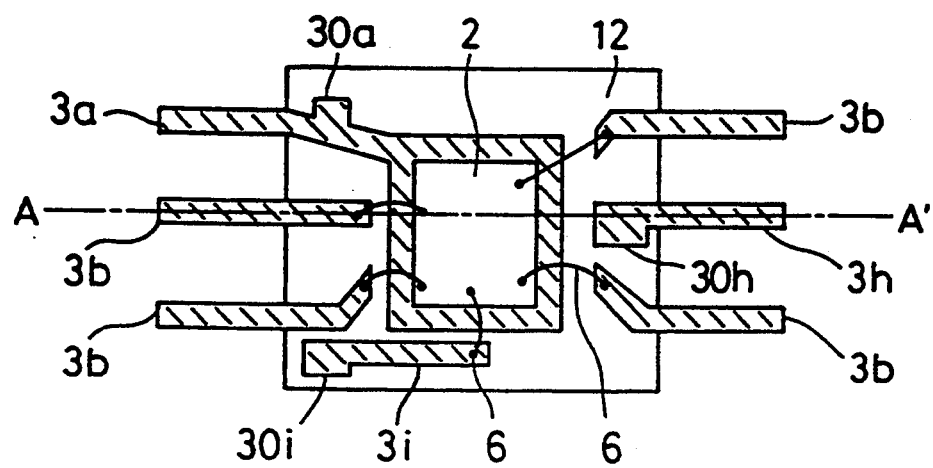
FIG. 12 is a top plan view showing a first film substrate before molding in accordance with a fifth embodiment of the present invention.
Figure 13:
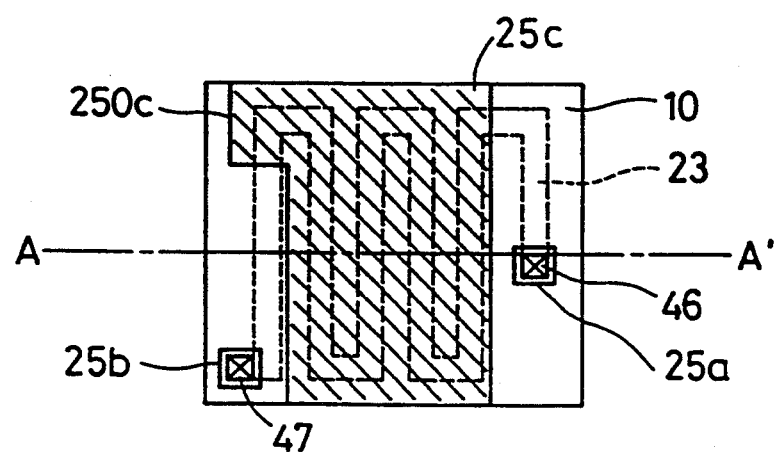
FIG. 13 is a top plan view showing a second film substrate before molding in accordance with the fifth embodiment of the present invention.

FIG. 12 is a top plan view showing the first film substrate 12 before molding in accordance with a fifth embodiment of the present invention. FIG. 13 is a top plan view showing the second film substrate 10 on which a spiral type inductor is present. In this embodiment, the film substrate on which the inductor is formed is laminated on the film substrate on which the semiconductor chip is mounted. In the figures, the semiconductor chip 2 is die-bonded on the top surface of the first film substrate 12 via the grounding pad 3a, the semiconductor chip 2 is connected to the external leads 3b by the wires 6, upper metal wiring patterns 3h and 3i are connected to upper metal wiring patterns on the second film substrate, and the upper metal wiring pattern 3i is connected to the semiconductor chip 2 by the wires 6. Further, in order to easily connect to upper metal wiring patterns on the second film substrate, additional parts 30a, 30h and 30i are respectively attached to the upper metal wiring patterns 3a, 3h and 3i. On the rear surface of the second film substrate 10, a meandering type inductor is formed by a lower metal wiring pattern 23 and both ends thereof are respectively connected to upper metal wiring patterns 25a and 25b via through holes 46 and 47. In addition, an upper metal wiring pattern 25c on the surface of the second film substrate 10, in a relatively large region excepting the region where the lower metal wiring patterns 25a and 25b are provided, becomes an electromagnetic shielding layer. Further, an additional part 250c is attached to this upper metal wiring pattern 25c, in order to easily connect to the additional part 30a to the grounding pad 3a on the first film substrate 12. Here, the upper metal wiring patterns 25a and 25b on the second film substrate 10 serve as connecting pads with the additional parts 30h and 30i of the upper metal wiring patterns 3h and 3i on the first film substrate 12.

Figure 14:
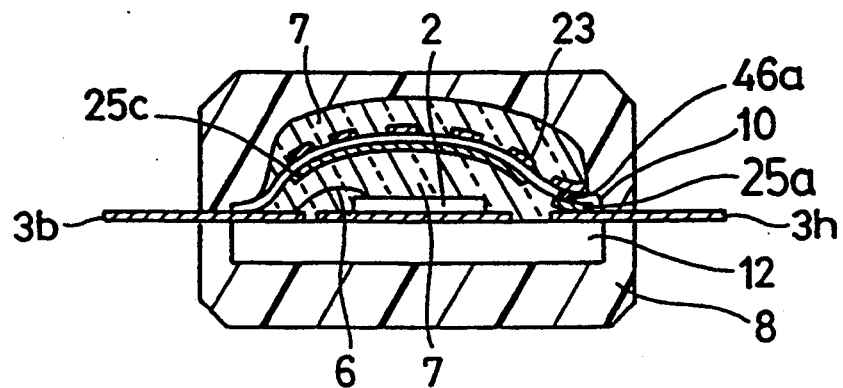
FIG. 14 is a cross sectional view showing a semiconductor device in which the first and the second film substrates are molded in the fifth embodiment.

In the first film substrate 12 constructed as described above, the semiconductor chip 2 is covered with the spacer material 7 after wire-bonding. And, as illustrated in FIG. 14, the top surface of the first film substrate 12 is opposite to the top surface of the second film substrate 10, the spacer material 7 intervenes between these film substrates, and the upper metal wiring patterns 25a and 25b and the additional part 250c on the surface of the second film substrate 10, are contacted, respectively, with upper metal wiring patterns 3h and 3i and the addition part 30a on the top surface of the first film substrate 12. In addition, the rear surface of the second film substrate 10 is covered with the spacer material 7. Next, in this state, molding is carried out with the molding material 8. Here, reference numeral 46a designates a conductive material filling the through hole 46.

As constructed as described above, since the inductor 23 is disposed in three dimensions over the semiconductor chip 2, the package is diminished in size. In addition, as described above, since the upper metal wiring pattern 25c, an electromagnetic shielding layer is disposed between the semiconductor chip 2 and the inductor 23 of the film substrate 10, the coupling of high frequency signals between the film substrates can be reduced, resulting in no deterioration of high frequency characteristics. Further, since the upper metal wiring pattern 25c covers the semiconductor chip 2, it is possible to reduce leakage of high frequency electromagnetic waves from the semiconductor chip 2 outside of the package, resulting in so-called high frequency shielding.

Further, in this fifth embodiment, by employing a harder material than the second film substrate 10 for the first film substrate 12, even if stress is added to the first film substrate 12 by bending the second film substrate 10 during molding, the semiconductor chip 2 is kept level and the chip 2 is not damaged, resulting in improved assembling and processing properties. Since a material having a lower dielectric constant than the molding material 8 is employed for the spacer material 7 between the first film substrate 12 and the second film substrate 10 and the spacer material 7 on the lower metal pattern 23 of the second film substrate 10, unnecessary parasitic capacitances can be reduced. Further, in the fifth embodiment, a lower metal wiring pattern may be formed on the rear surface of the first film substrate 12 and this wiring pattern may be connected to the upper metal wiring patterns via through holes.

While, in the above-described embodiments, the spiral type and/or the meandering type inductor is shown as a circuit element which is constructed with the upper and/or the lower metal wiring pattern of the insulating film substrate, a stub for matching impedance, a resonance circuit or the like may be constructed with wiring patterns.

Figure 15:
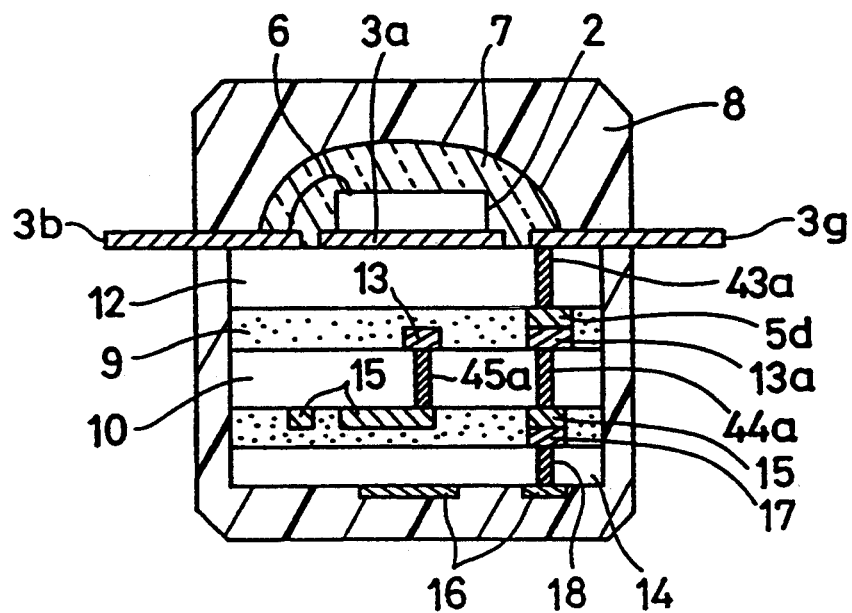
FIG. 15 is a cross sectional view showing a semiconductor device in which three film substrates are laminated in accordance with the fourth embodiment of the present invention.

The number of times of bending the film substrate is bent in the second embodiment, the times of rolling the film substrate in the third embodiment and the times of stacking the film substrates in the fourth and the fifth embodiments are not limited thereto. For example, as illustrated in FIG. 15, by disposing a third film substrate 14 having an upper metal wiring pattern 17 and a lower metal wiring pattern 16 mutually connected via a through hole conductive material 18 under the second film substrate 10 and connecting the film substrate 14 to a lower metal wiring pattern 15 on the second film substrate 10 with the upper metal wiring pattern 17, a semiconductor device having a structure of three laminated film substrates can be obtained.

Still, while the insulating adhesive 9 is disposed between the film substrates in the second to the fifth embodiments, since the adhesive 9 is applied to insulate rather than to adhere materials, the adhesive 9 is not required if there is no possibility of short-circuiting.

As described above, in a semiconductor device in accordance with the present invention, the molding is conducted in a state where an insulating film substrate is bent and stacked in another film, an insulating film substrate is bent several times and laminated or an insulating film substrate is rolled into a spiral shape. This provides a miniaturized package. By disposing an electromagnetic shielding layer between the laminated surfaces of the film substrate, coupling of high frequency signals between the neighboring surfaces of the film substrate is prevented, providing a package with less deterioration of high frequency characteristics.

Since a plurality of insulating film substrates are employed, the second film substrate adheres to the surface of the first film substrate opposite the surface on which a semiconductor chip is present, and the semiconductor chip on the first film substrate is electrically connected to circuit elements on the second film substrate, or since molding is conducted in a state where the second film substrate is laminated and adheres to the first film substrate having the semiconductor chip covered with an insulating spacer material and the semiconductor chip on the first film substrate connected to the circuit elements on the second film substrate, the circuit is disposed in three dimensions, resulting in a miniaturized package.

When the second film substrate is laminated on the first film substrate, since an electromagnetic shielding layer is disposed on the second film substrate to cover the semiconductor chip on the first film substrate, radiation of electromagnetic waves from the circuit elements on the first film substrate or coupling of high frequency signals with the circuit elements outside the package is prevented, resulting in obtaining a package having high reliability.

By employing a material having a high rigidity for the film substrate mounting the semiconductor chip thereon, among the plural film substrates, a package that is easily fabricated and processed is provided, which package prevents bending stress from being added to the semiconductor chip, rarely destroying the chip.

By covering the semiconductor chip or the circuit elements with a material having a dielectric constant lower than a molding material, parasitic capacitances over circuit elements such as the semiconductor chip or metal wiring patterns are reduced, providing a package having less deterioration in high frequency characteristics.

What is claimed is:

1. A packaged semiconductor device comprising:
   a folded flexible insulating film substrate having a front surface and a rear surface and including a fold so that a first part of said rear surface faces a second part of said rear surface;
   a high frequency semiconductor chip disposed on said front surface;
   circuit elements disposed on said front surface and connected to said semiconductor chip;
   an insulating adhesive layer disposed between and bonding the first and second parts of said rear surface; and
   a resin encapsulating said folded flexible insulating film substrate, said high frequency semiconductor chip, said circuit elements, and said insulating adhesive layer.

2. The packaged semiconductor device of claim 1 comprising an electromagnetic shielding layer disposed between the first and second parts of said rear surface.

3. A packaged semiconductor device comprising:
   a folded flexible insulating film substrate having a front surface and a rear surface and including multiple folds of alternating directions so that said folded flexible insulating film substrate has a serpentine cross-section and respective parts of said front surface face each other and respective parts of said rear surface face each other;
   a high frequency semiconductor chip disposed on said front surface;
   circuit elements disposed on said front surface and connected to said high frequency semiconductor chip;
   an insulating adhesive layer disposed between and bonding facing parts of said front and rear surfaces; and
   a resin encapsulating said folded flexible insulating film substrate, said high frequency semiconductor chip, said circuit elements, and said insulating adhesive layer.

4. The packaged semiconductor device of claim 3 wherein said high frequency semiconductor chip and said circuit elements are disposed on different folds of said folded flexible insulating film substrate.

5. The packaged semiconductor device of claim 3 comprising an electromagnetic shielding layer disposed on the rear surface of said folding flexible insulating film substrate.

6. A packaged semiconductor device comprising:
   a flexible rolled insulating film substrate having a front surface and a rear surface and rolled so that the flexible rolled insulating film substrate has a spiral cross-section;
   a high frequency semiconductor chip disposed on said front surface;
   circuit elements disposed on said front surface and connected to said high frequency semiconductor chip;
   an insulating adhesive layer disposed between and bonding said front and rear surfaces; and
   a resin encapsulating said flexible rolled insulating film substrate, said high frequency semiconductor chip, said circuit elements, and said insulating adhesive layer.

7. The packaged semiconductor device of claim 6 comprising an electromagnetic shielding layer covering the rear surface of said flexible rolled insulating film substrate.

8. The packaged semiconductor device of claim 1 wherein said resin has a dielectric constant and including a second material covering said high frequency semiconductor chip and having a dielectric constant lower than the dielectric constant of said resin.

9. The packaged semiconductor device of claim 3 wherein said resin has a dielectric constant and including a second material covering said high frequency semiconductor chip and having a dielectric constant lower than the dielectric constant of said resin.

10. The packaged semiconductor device of claim 6 wherein said resin has a dielectric constant and including a second material covering said high frequency semiconductor chip and having a dielectric constant lower than the dielectric constant of said resin.

* * * * *